United States Patent [19]
Harrison

[11] Patent Number: 6,119,242
[45] Date of Patent: Sep. 12, 2000

[54] SYNCHRONOUS CLOCK GENERATOR INCLUDING A FALSE LOCK DETECTOR

[75] Inventor: Ronnie M. Harrison, Boise, Id.

[73] Assignee: Micron Technology, Inc., Boise, Id.

[21] Appl. No.: 09/318,293

[22] Filed: May 25, 1999

Related U.S. Application Data

[63] Continuation of application No. 08/921,236, Aug. 29, 1997, Pat. No. 5,940,609.

[51] Int. Cl.$^7$ ........................................... G06F 1/04
[52] U.S. Cl. ............................................... 713/503
[58] Field of Search .................... 713/400, 401, 713/500, 503; 375/373, 375, 376; 327/147, 149, 150, 155, 156, 158, 159; 331/1 A, DIG. 2

[56] References Cited

U.S. PATENT DOCUMENTS

| | | | |
|---|---|---|---|
| 4,077,016 | 2/1978 | Sanders et al. | 331/4 |
| 4,481,625 | 11/1984 | Roberts et al. | 370/85 |
| 4,573,017 | 2/1986 | Levine | 327/114 |
| 4,687,951 | 8/1987 | McElroy | 307/269 |
| 4,773,085 | 9/1988 | Cordell | 375/120 |
| 4,893,087 | 1/1990 | Davis | 328/14 |
| 4,902,986 | 2/1990 | Lesmeister | 331/25 |
| 5,020,023 | 5/1991 | Smith | 364/900 |
| 5,038,115 | 8/1991 | Myers et al. | 331/2 |
| 5,087,828 | 2/1992 | Sato et al. | 307/369 |
| 5,256,989 | 10/1993 | Parker et al. | 331/1 A |
| 5,257,294 | 10/1993 | Pinto et al. | 375/120 |
| 5,268,639 | 12/1993 | Gasbarro et al. | 324/158 R |
| 5,283,631 | 2/1994 | Koerner et al. | 307/451 |
| 5,295,164 | 3/1994 | Yamamura | 375/120 |
| 5,311,483 | 5/1994 | Takasugi | 365/233 |
| 5,337,285 | 8/1994 | Ware et al. | 365/227 |
| 5,390,308 | 2/1995 | Ware et al. | 395/400 |
| 5,408,640 | 4/1995 | MacIntyre et al. | 395/550 |
| 5,420,544 | 5/1995 | Ishibashi | 331/11 |

(List continued on next page.)

FOREIGN PATENT DOCUMENTS

| | | |
|---|---|---|
| 0 295 515 A1 | 12/1988 | European Pat. Off. . |
| 0 476 585 A3 | 3/1992 | European Pat. Off. . |
| 0 704 848 A3 | 4/1996 | European Pat. Off. . |
| 0 704 975 A1 | 4/1996 | European Pat. Off. . |
| 0 767 538 A1 | 4/1997 | European Pat. Off. . |
| WO 94/29871 | 12/1994 | WIPO . |
| WO 95/22200 | 8/1995 | WIPO . |
| WO 95/22206 | 8/1995 | WIPO . |
| WO 97/14289 | 4/1997 | WIPO . |
| WO 97/42557 | 11/1997 | WIPO . |

OTHER PUBLICATIONS

Alvarez, J. et al. "A Wide–Bandwidth Low Voltage PLL for PowerPC™ Microprocessors" IEEE IEICE Trans. Electron., vol. E–78. No. 6, Jun. 1995, pp. 631–639.

Anonymous, "400MHz SLDRAM, 4M X 16 SLDRAM Pipelined, Eight Bank, 2.5 V Operation," SLDRAM Consortium Advance Sheet, published throughout the United States, pp. 1–22.

Anonymous, "Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

Arai, Y. et al., "A CMOS Four Channel x 1K Time Memory LSI with 1–ns/b Resolution", IEEE Journal of Solid–State Circuits, vol. 27, No. 3, M, 8107 Mar., 1992, No. 3, New York, US, pp. 359–364 and pp. 528–531.

(List continued on next page.)

*Primary Examiner*—Thomas M. Heckler
*Attorney, Agent, or Firm*—Dorsey & Whitney LLP

[57] ABSTRACT

A false lock detector for use in conjunction with a locked loop which produces a plurality of output signals in response to a clock signal is comprised of a logic circuit for receiving first and second signals produced by the locked loop. The logic circuit determines if a predetermined phase relationship exists between the first and second signals and produces an output signal indicative of that determination.

14 Claims, 4 Drawing Sheets

U.S. PATENT DOCUMENTS

| | | | |
|---|---|---|---|
| 5,428,311 | 6/1995 | McClure | 327/276 |
| 5,428,317 | 6/1995 | Sanchez et al. | 331/1 A |
| 5,430,676 | 7/1995 | Ware et al. | 365/189.02 |
| 5,440,514 | 8/1995 | Flannagan et al. | 365/194 |
| 5,446,696 | 8/1995 | Ware et al. | 365/222 |
| 5,448,193 | 9/1995 | Baumert et al. | 327/156 |
| 5,465,076 | 11/1995 | Yamauchi et al. | 331/179 |
| 5,473,274 | 12/1995 | Reilly et al. | 327/159 |
| 5,473,639 | 12/1995 | Lee et al. | 375/376 |
| 5,489,864 | 2/1996 | Ashuri | 327/161 |
| 5,539,345 | 7/1996 | Hawkins | 327/150 |
| 5,544,203 | 8/1996 | Casasanta et al. | 375/376 |
| 5,552,727 | 9/1996 | Nakao | 327/159 |
| 5,568,075 | 10/1996 | Curran et al. | 327/172 |
| 5,572,557 | 11/1996 | Aoki | 375/376 |
| 5,577,236 | 11/1996 | Johnson et al. | 395/551 |
| 5,578,940 | 11/1996 | Dillon et al. | 326/30 |
| 5,614,855 | 3/1997 | Lee et al. | 327/158 |
| 5,657,481 | 8/1997 | Farmwald et al. | 395/551 |
| 5,675,274 | 10/1997 | Kobayashi et al. | 327/158 |
| 5,692,165 | 11/1997 | Jeddeloh et al. | 395/551 |
| 5,712,580 | 1/1998 | Baumgartner et al. | 327/142 |
| 5,751,665 | 5/1998 | Tanoi | 368/120 |
| 5,812,619 | 9/1998 | Runaldue | 375/376 |
| 5,889,829 | 3/1999 | Chiao et al. | 375/376 |

OTHER PUBLICATIONS

Arai, Y. et al., "A Time Digitizer CMOS Gate–Array with a 250 ps Time Resolution", XP 000597207, IEEE Journal of Solid–State Circuits, vol. 31, No. 2, Feb. 1996, pp. 212–220.

Aviram, A. et al., "Obtaining High Speed Printing on Thermal Sensitive Special Paper with a Resistive Ribbon Print Head", IBM Technical Disclosure Bulletin, vol. 27, No. 5, Oct. 1984, pp. 3059–3060.

Bazes, M., "Two Novel Fully Complementary Self–Biased CMOS Differential Amplifiers", IEEE Journal of Solid–State Circuits, vol. 26, No. 2, Feb. 1991, pp. 165–168.

Cho, J. "Digitally–Controlled PLL with Pulse Width Detection Mechanism for Error Correction", ISSCC 1997, Paper No. SA 20.3, pp. 334–335.

Christiansen, J., "An Integrated High Resolution CMOS Timing Generator Based on an Array of Delay Locked Loops", IEEE Journal of Solid–State Circuits, vol. 31, No. 7, Jul. 1996, pp. 952–957.

Combes, M. et al., "A Portable Clock Multiplier Generator Using Digital CMOS Standard Cells", IEEE Journal of Solid–State Circuits, vol. 31, No. 7, Jul. 1996, pp. 958–965.

Donnelly, K. et al., "A 660 MB/s Interface Megacell Portable Circuit in 0.3 $\mu$m–0.7 $\mu$m CMOS ASIC", IEEE Journal of Solid–State Circuits, vol. 31, No. 12, Dec. 1996, pp. 1995–2001.

Goto, J. et al., "A PLL–Based Programmable Clock Generator with 50– to 350–MHz Oscillating Range for Video Signal Processors", IEICE Trans. Electron., vol. E77–C, No. 12, Dec. 1994, pp. 1951–1956.

Ishibashi, A. et al., "High–Speed Clock Distribution Architecture Employing PLL for 0.6 $\mu$m CMOS SOG", IEEE Custom Integrated Circuits Conference, 1992, pp. 27.6.1–27.6.4.

Kim, B. et al., "A 30MHz High–Speed Analog/Digital PLL in 2 $\mu$m CMOS", ISSCC, Feb. 1990.

Kikuchi, S. et al., "A Gate–Array–Based 666MHz VLSI Test System", IEEE International Test Conference, Paper 21.1, 1995, pp. 451–458.

Ko, U. et al., "A 30–ps Jitter, 3.6–$\mu$s Locking, 3.3–Volt Digital PLL for CMOS Gate Arrays", IEEE Custom Integrated Circuits Conference, 1993, pp. 23.3.1–23.3.4.

Lee, T. et al., "A 2.5V Delay–Locked Loop for an 18Mb 500MB/s DRAM", IEEE International Solid–State Circuits Conference Digest of Technical Papers, Paper No. FA 18.6, 1994, pp. 300–301.

Lesmeister, G., "A Densely Integrated High Performance CMOS Tester", International Test Conference, Paper 16.2, 1991, pp. 426–429.

Maneatis, J., "Low–Jitter Process–Independent DLL and PLL Based on Self–Biased Techniques", IEEE Journal of Solid–State Circuits, vol. 31, No. 11, Nov. 1996, pp. 1723–1732.

Nakamura, M. et al., "A 156 Mbps CMOS Clock Recovery Circuit for Burst–mode Transmission", Symposium on VLSI Circuits Digest of Technical Papers, 1996, pp. 122–123.

Nielson, E., "Inverting latches make simple VCO", EDN, Jun. 19, 1997.

Novof, I. et al., "Fully Integrated CMOS Phase–Locked Loop with 15 to 249 MHz Locking Range and ±50 ps Jitter", IEEE Journal of Solid–State Circuits, vol. 30, No. 11, Nov. 1995, pp. 1259–1266.

Santos, D. et al., "A CMOS Delay Locked Loop And Sub–Nanosecond Time–to–Digital Converter Chip", IEEE Nuclear Science Symposium and Medical Imaging Conference Record, vol. 1, Oct. 1995, pp. 289–291.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

Shirotori, T. et al., "PLL–based, Impedance Controlled Output Buffer", 1991 Symposium on VLSI Circuits Digest of Technical Papers, pp. 49–50.

Sidiropoulos, S. et al., "A 700–Mb/s/pin CMOS Signaling Interface Using Current Integrating Receivers", IEEE Journal of Solid–State Circuits, vol. 32, No. 5, May 1997, pp. 681–690.

Sidiropoulos, S. et al., "A CMOS 500 Mbps/pin synchronous point to point link interface", IEEE Symposium on VLSI Circuits Digest of Technical Papers, 1994, pp. 43–44.

Sidiropoulos, S. et al., "A Semi–Digital DLL with Unlimited Phase Shift Capability and 0.08–400MHz Operating Range," IEEE International Solid State Circuits Conference, Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Tanoi, S. et al., "A 250–622 MHz Deskew and Jitter–Suppressed Clock Buffer Using a Frequency– and Delay–Locked Two–Loop Architecture", 1995 Symposium on VLSI Circuits Digest of Technical Papers, vol. 11, No. 2, pp. 85–86.

Tanoi, S. et al., "A 250–622 MHz Deskew and Jitter–Suppressed Clock Buffer Using Two–Loop Architecture", IEEE IEICE Trans. Electron., vol. E–79–C. No. 7, Jul. 1996, pp. 898–904.

von Kaenel, V. et al., "A 320 MHz, 1.5 mW @ 1.35 V CMOS PLL for Microprocessor Clock Generation", IEEE Journal of Solid–State Circuits, vol. 31, No. 11, Nov. 1996, pp. 1715–1722.

Watson, R. et al., "Clock Buffer Chip with Absolute Delay Regulation Over Process and Environmental Variations", IEEE Custom Integrated Circuits Conference, 1992, pp. 25.2.1–25.2.5.

Yoshimura, T. et al. "A 622–Mb/s Bit/Frame Synchronizer for High–Speed Backplane Data Communication", IEEE Journal of Solid–State Circuits, vol. 31, No. 7, Jul. 1996, pp. 1063–1066.

SYNCHRONOUS CLOCK GENERATOR INCLUDING A FALSE LOCK DETECTOR

CROSS REFERENCE TO RELATED APPLICATION

This application is a continuation of U.S. patent application Ser. No. 08/921,236, filed Aug. 29, 1997, issued Aug. 17, 1999, Pat. No. 5,940,609.

BACKGROUND OF THE INVENTION

This application is related to U.S. patent application Ser. No. 08/921,237 filed on the same day as the instant application by the same assignee as the present invention and entitled Synchronous Clock Generator Including A Delay-Locked Loop Signal Loss Detector now U.S. Pat. No. 5,926,047.

1. Field of the Invention

The present invention is directed generally to the field of integrated circuits and, more particularly, to the generation of clock signals for controlling the operation of such circuits.

2. Description of the Background

Many high-speed integrated circuit devices, such as synchronous dynamic random access memories (SDRAM), microprocessors, etc. rely upon clock signals to control the flow of commands, data, addresses, etc., into, through, and out of the devices. Additionally, new types of circuit architectures such as RAMBUS and SLD-RAM require individual parts to work in unison even though such parts may individually operate at different speeds. As a result, the ability to control the operation of a part through the generation of local clock signals has become increasingly more important.

Typically, operations are initiated at the edges of the clock signals (i.e., transitions from high to low or low to high). To more precisely control the timing of operations within the device, each period of a clock signal is sometimes divided into subperiods so that certain operations do not begin until shortly after the clock edge.

One method for controlling the timing of operations within a period of a clock signal generates phase-delayed versions of the clock signal. For example, to divide the clock period into four subperiods, phase delayed versions are produced that lag the clock signal by 90°, 180° and 270°, respectively. Edges of the phase-delayed clock signals provide signal transitions at the beginning or end of each subperiod that can be used to initiate operations.

An example of such an approach is shown in FIG. 1 where the timing of operations in a memory device 10 is defined by an externally provided control clock reference signal CCLKREF and an externally provided data clock reference signal DCLKREF. The reference clock signals CCLKREF, DCLKREF are generated in a memory controller 11 and transmitted to the memory device 10 over a control clock bus 13 and a data clock bus 14, respectively. The reference clock signals CCLKREF, DCLKREF have identical frequencies, although the control clock reference signal CCLKREF is a continuous signal and the data clock reference signal DCLKREF is a discontinuous signal, i.e., the data clock reference signal DCLKREF does not include a pulse for every clock period. Although the reference clock signals CCLKREF, DCLKREF have equal frequencies, they may be phase shifted by a lag time upon arrival at the memory device 10 due to differences in propagation times, such as may be produced by routing differences between the control clock bus 13 and the data clock bus 14.

Control data CD1-CDN arrive at respective input terminals 16 substantially simultaneously with pulses of the control clock reference signal CCLKREF and are latched in respective control data latches 18. However, if the device attempts to latch the control data CD1-CDN immediately upon the edge of the control clock reference signal CCLKREF, the control data may not have sufficient time to develop at the input terminals 16. For example, a voltage corresponding to a first logic state (e.g., a "0") at one of the input terminals 16 may not change to a voltage corresponding to an opposite logic state (e.g., a "1") by the time the data are latched. To allow time for the control data CD1-CDN to fully develop at the input terminals 16, the control data are latched at a delayed time relative to the control clock reference signal CCLKREF. To provide a clock edge to trigger latching of the control data CD1-CDN at the delayed time, a delay circuit 20 delays the control clock reference signal CCLKREF by a delay time to produce a first delayed clock signal CCLKD. Edges of the first delayed clock signal CCLKD activate the control data latches 18 to latch the control data CD1-CDN.

Data DA1-DAM arrive at data terminals 22 substantially simultaneously with the data clock reference signal DCLKREF. Respective data latches 24 latch the data DA1-DAM. As with the control data CD1-CDN, it is desirable that the data DA1-DAM be latched with a slight delay relative to transitions of the data clock reference signal DCKLREF to allow time for signal development at the data terminals 22. To provide a delayed clock edge, a delay circuit 26 delays the data clock reference signal DCLKREF to produce a phase-delayed data clock DCLKD that is delayed relative to the data clock reference signal DCLKREF.

For latching both control data CD1-CDN and data DA1-DAM, it is often desirable to allow some adjustment of the phase delay. For example, if the clock frequencies change, the duration of the subperiods will change correspondingly. Consequently, the delayed clocks CCLKD, DCLKD may not allow sufficient signal development time before latching the control data or data, respectively. Also, variations in transmission times of control data, data, or clock signals may cause shifts in arrival times of control data CD1-CDN or data DA1-DAM relative to the clock signals CCLKREF, DCLKREF, respectively, of the memory device 10.

One possible approach to producing a variable delay is for the control clock generator to employ a delay-locked loop 28 driven by the external reference clock CLKREF, as shown in FIG. 2. The control clock reference signal CLKREF is input to a conventional, multiple output, variable delay line 30 such as that described in Maneatis, "Low-Jitter Process-Independent DLL and PLL Based on Self-Biased Techniques," *IEEE Journal of Solid-State Circuits* 31(11):1723–1732, November 1996. The delay line 30 is a known circuit that outputs multiple delayed signals CLK1-CLKN with increasing lags relative to the reference signal CLKREF. The delays of the signals CLK1-CLKN are variably responsive to a control signal Vcon received at a control port 32.

A feedback path, formed by a comparator 34 and an integrator 36, produces the control signal Vcon. The feedback path receives the control clock reference signal CCLKREF at one input of the comparator 34 and receives one of the output signals CLKN from the delay line 30 as a feedback signal at the other input of the comparator 34. The comparator 34 outputs a compare signal Vcomp that is integrated by the integrator 36 to produce the control signal Vcon.

As is known, the control signal Vcon will depend upon the relative phases of the control clock reference signal CCLKREF and the feedback signal CLKN. If the feedback signal CLKN leads the control clock reference signal CCLKREF, the control signal Vcon increases the delay of the delay line 30, thereby reducing the magnitude of the control signal Vcon until the feedback signal CLKN is in phase with the control clock reference signal CCLKREF. Similarly, if the feedback signal CLK lags the control clock reference signal CCLKREF, the control signal Vcon causes the delay line 30 to decrease the delay until the feedback signal CLKN is in phase with the control clock reference signal CCLKREF.

A delay-locked loop may obtain a "false lock". In the case of a delay-locked loop, the voltage-control delay line may store multiples of the desired interval even though the output-to-input phase relationship would look identical to the desired relationship. For example, the desired storage (delay) may be 180°, but the actual storage (delay) may be 540°. That could cause a problem if the delay line were used to create local clocks, because the tap-to-tap spacing would be three times the desired spacing.

It is possible to address the issue of false lock by comparing the control voltage to an expected value of the control voltage to determine if the actual value is likely to be causing an extraordinarily long delay. However, comparison of the control voltage to an expected value of the control voltage is generally impractical because process variations, temperature, and supply voltage variations make it difficult to accurately predict the expected control voltage. If the loop is to handle a range of frequencies, the task of comparing the actual control voltage to an expected value of the control voltage becomes even more difficult. Thus, the need exists for a false lock detector which is capable of accurately determining when a false lock has occurred and taking or initiating corrective action.

SUMMARY OF THE INVENTION

The present invention is directed to a false lock detector for use in conjunction with a locked loop which produces a plurality of output signals in response to a clock signal. The false lock detector is comprised of a logic circuit for receiving first and second signals produced by the locked loop. The logic circuit determines if a predetermined phase relationship exists between the received signals and produces an output signal indicative of that determination.

The false lock detector of the present invention may be incorporated into a synchronous clock generator. The synchronous clock generator is comprised of a receiver for receiving an external clock signal. A delay line is responsive to the receiver for producing a plurality of output signals each having a predetermined delay with respect to the external clock signal. A feedback path is responsive to certain of the plurality of output signals for producing a feedback signal which is input to the delay line. A plurality of multiplexers is responsive to the delay line for producing at least one clock signal in response to control signals. The logic circuit receives first and second signals produced by the delay line. The logic circuit determines if a predetermined phase relationship exists between the first and second signals and produces an output signal indicative of that determination.

The false lock detector of the present invention provides an early indication that a locked loop is not properly locked. The output of the false lock detector can be used to take corrective action or to initiate corrective action. By promptly recognizing and correcting for a false lock condition, adverse consequences resulting therefrom may be avoided. Those advantages and benefits of the present invention, and others, will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein.

DESCRIPTION OF THE PREFERRED EMBODIMENTS

Figure 1:
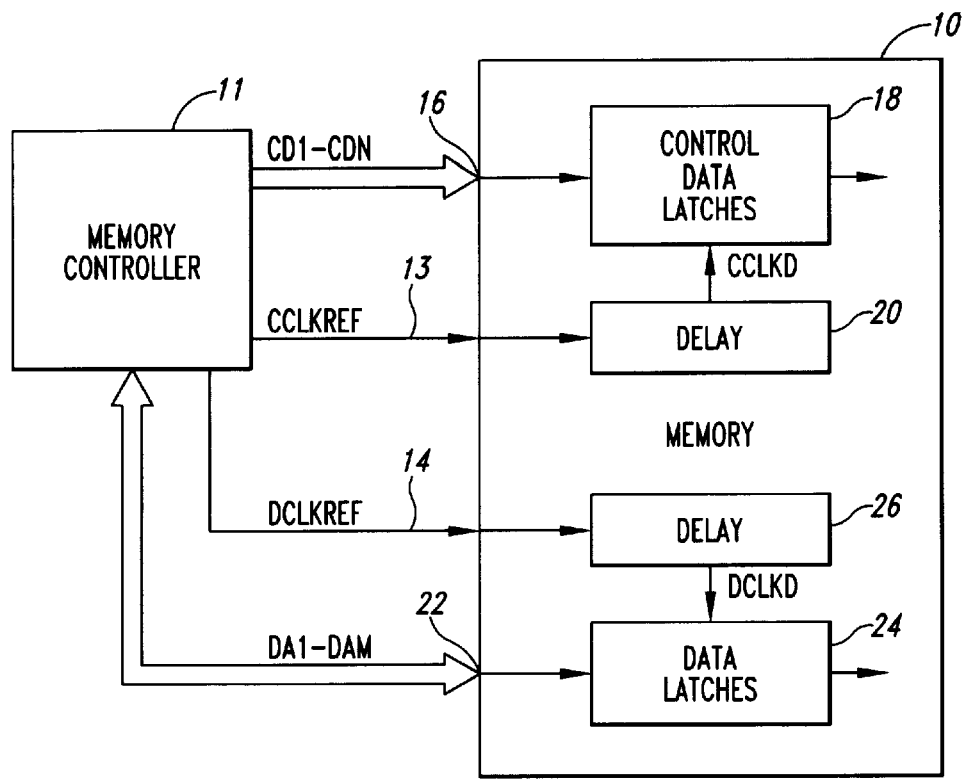
FIG. 1 is a block diagram of a prior art memory system including a memory device and a memory controller linked by control data and data buses.
Figure 2:
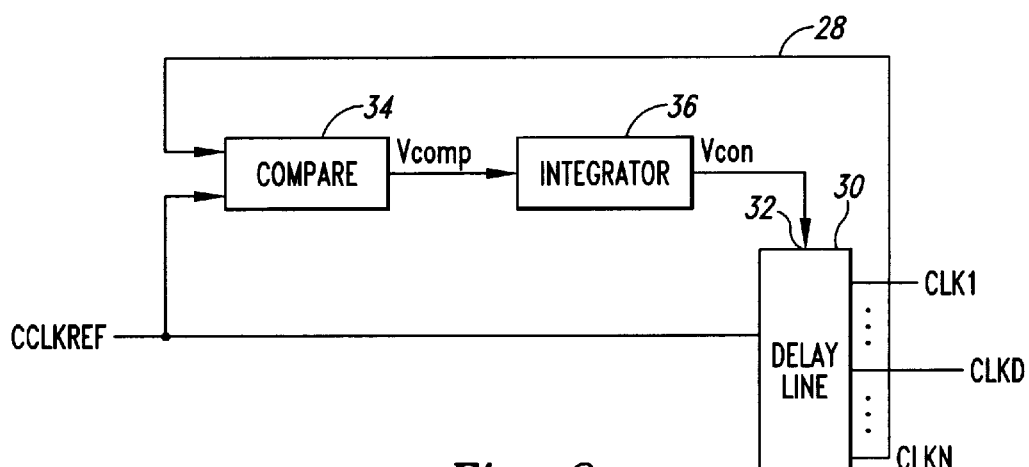
FIG. 2 is a block diagram of a prior art delay-locked loop driven by an external control reference clock signal.
Figure 3:
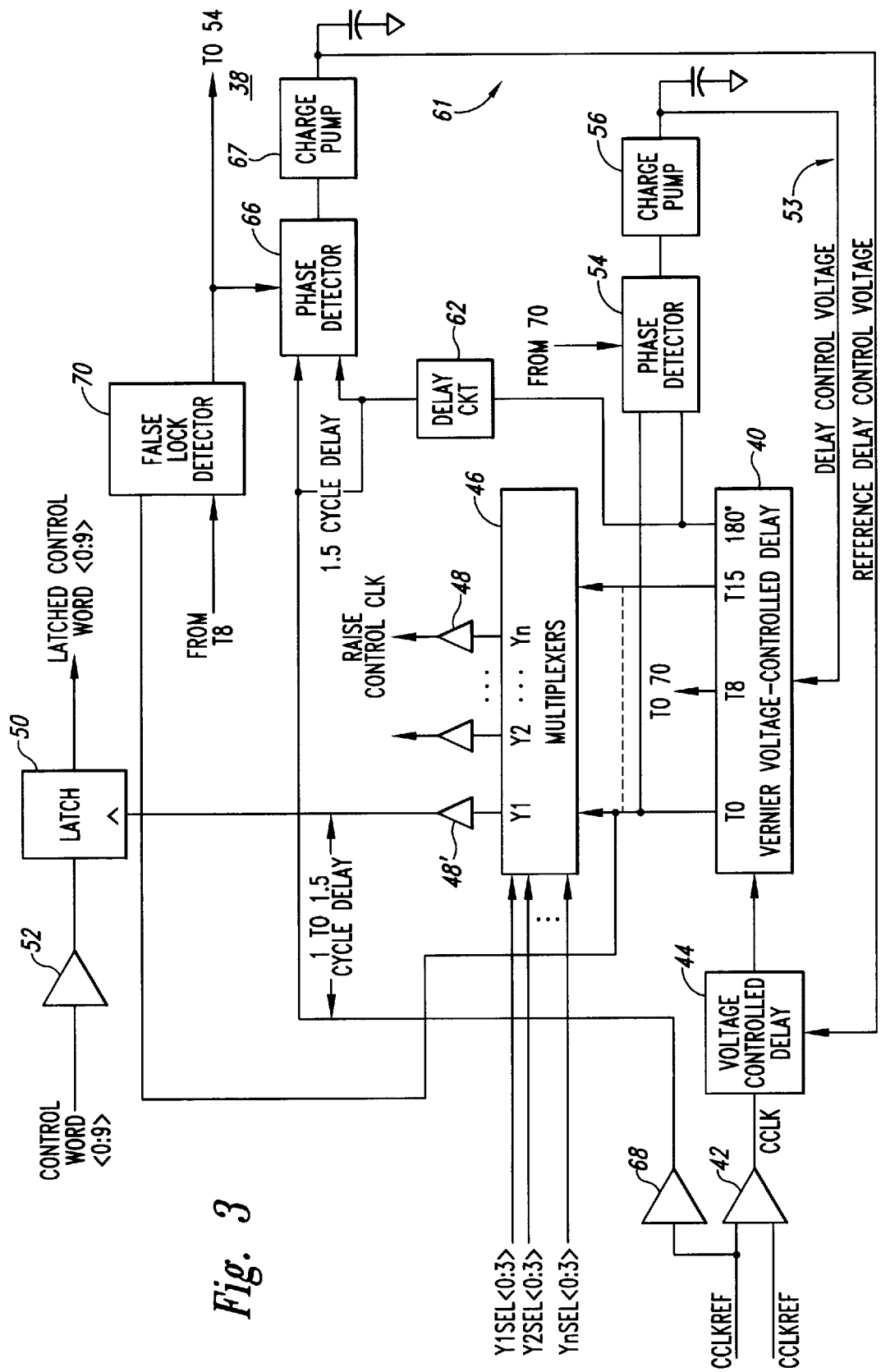
FIG. 3 is a block diagram of a synchronous clock generator including a false lock detector according to the teachings of the present invention.

FIG. 3 is a block diagram of a synchronous clock generator circuit 38. The circuit 38 illustrated in FIG. 3 is designed for use by a dynamic random access memory (DRAM) which is used in a SLD-RAM architecture. Although the present invention is described with respect to a particular circuit used in a particular architecture, the reader will understand that the concepts of the present invention may be used in other circuits as well as other circuit architectures. The present invention may be employed wherever it is desirable to precisely control the production of local clock signals.

A component of the circuit 38 is a delay line 40. The delay line 40 may be constructed according to the teachings of the prior art as set forth in the article entitled "Low-Jitter Process-Independent DLL and PLL Based on Self-Biased Techniques." As is known in the art, the delay line 40 has a number of taps associated therewith. As shown in FIG. 3, the delay line 40 has taps labeled T0–T15, with the last tap labeled 180°. Alternatively, the delay line 40 may be a vernier voltage-controlled delay line 40 of the type disclosed in U.S. patent application Ser. No. _____filed Jun. 20, 1997 and entitled Method And Apparatus For Generating A Sequence Of Clock Signals, which is assigned to the same assignee as the present invention.

The delay line 40 receives clock signals that are received at a differential receiver 42. The differential receiver 42 receives the signals CCLKREF, $\overline{\text{CCLKREF}}$. The present invention will work with a variety of receivers other than the differential receiver 42 illustrated in FIG. 3. The clock signal CCLK is input to the delay line 40 through a voltage controlled delay circuit 44.

The output of the delay line 40 is input to a plurality of multiplexers 46 which produces clock signals input to clock drivers 48. One of the clock drivers 48' produces a clock signal which is input to a latch 50. The latch 50 receives control data through a receiver 52 and latches that data in response to the clock signal output by the clock driver 48'. The latched control data is available at the output of the latch 50.

A first feedback path 53 is comprised of a phase detector 54 and a charge pump 56. The phase detector 54 receives two signals from the delay line 40 such as the signal available at the T0 tap and the signal available at the 180° tap. From those signals, a control signal is generated which is input to the charge pump 56. Charge pump 56 produces a delay control voltage input to the delay line 40. The first feedback path 53 and the delay line 40 comprise a delay-locked loop.

The delay line 40 may be provided with a second, or compound, feedback path 61. The second feedback path 61 is comprised of a delay matching circuit 62, a phase detector 66, and a charge pump 67. The phase detector 66 receives the control clock reference signal CCLKREF through a receiver 68 and a signal from the delay matching circuit 62. The phase detector 66 and charge pump 67 work in the same manner as the phase detector 54 and charge pump 56. Based on the signals input to the phase detector 66, the charge pump 67 produces a reference delay control voltage which is input to the voltage controlled delayed circuit 44. As a result, the delay-locked loop can be tuned by the second feedback path 61 to add or subtract delay to the loop by controlling the voltage control delay circuit 44. Additional information about the compound feedback path 61 is found in U.S. patent application Ser. No. 08/921,237, filed herewith and entitled Synchronous Clock Generator Including A Compound Delay-Locked Loop, which is assigned to the same assignee as the present invention.

Figure 4A:
FIG. 4A–4C and 5A–5C are timing diagrams helpful in understanding the operation of the false lock detector shown in FIG. 3.
Figure 4B:
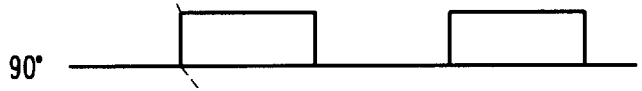
Figure 4C:
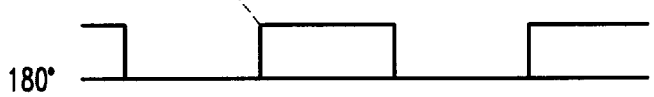

Completing the description of FIG. 3, a false lock detector 70 constructed according to the teachings of the present invention is provided. The false lock detector 70 receives a 0° signal (FIG. 4A) and a 90° signal (FIG. 4B). Under "true" lock conditions, the 90° signal is low when the 0° signal (FIG. 4A) transitions high. Under "false" lock conditions, the 90° signal (FIG. 5B) is high when the 0° signal (FIG. 5A) transitions high. Even though the 180° signal (FIG. 5C) appears to be 180° out of phase with the 0° signal (FIG. 5A), the difference in phase could 540°. Under such circumstances, the delay line 40 is causing too long of a delay thereby causing too much signal to be stored. By comparing the phases of the 0° signal and 90° signal using, for example, a D-type flip-flop, an output signal may be produced which is input to the phase detectors 54, 66 to reduce the amount of delay in the event that a false lock has, occurred. Signals other than the 0° signal and 90° signal may be used assuming that the phase relationship between the two signals that are used is known.

Figure 6:
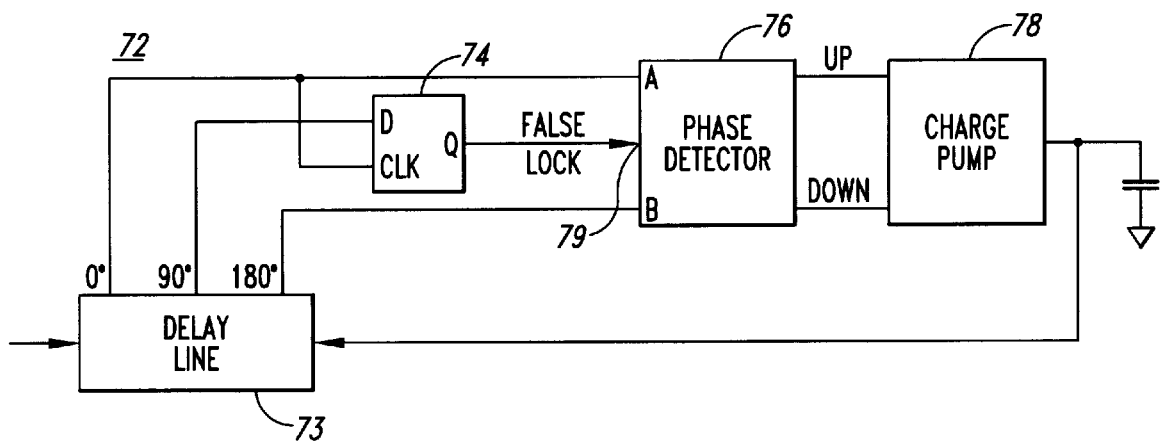
FIG. 6 illustrates a delay-locked loop having a false lock detector.

In FIG. 6, a simplified delay-locked loop 72 is illustrated. The delay-lock loop 72 is comprised of a delay line 73, a phase detector 76, and a charge pump 78 as discussed hereinabove in conjunction with FIG. 3. A D-type flip-flop 74 receives the 0° signal at a clock input terminal thereof and the 90° signal at a D-input terminal thereof The phase detector 76 receives the 0° signal at an A terminal, the 180° signal at a B terminal, and a signal available at the Q output terminal of the flip-flop 74 at a "force down" terminal 79. Two control signals, an up signal and a down signal, are produced by the phase detector 76 and are used to control the charge pump 78.

Figure 5A:
Figure 5B:
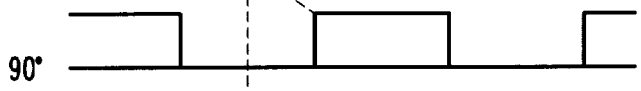
Figure 5C:

In the example shown in FIGS. 5A–5C, if the 180° signal leads the 0° signal, then the 180° signal is "early". The phase detector 76 asserts the up signal with a duty cycle proportional to the phase difference. Under those conditions, the down signal is inactive. If the 180° signal lags the 0° signal, the phase detector asserts the down signal, while the up signal is inactive. If the false lock signal is asserted, the up signal is forced inactive while the down signal is forced on. That causes the delay to decrease until the delay through the delay line 73 is less than 360°. When the delay is less than 360°, a false lock condition should no longer exist, at which point normal lock processes take over. It may be advantageous to pick a later internal tap to sample, such as the signal available at the 135° tap as opposed to the signal available at the 90° tap, so that the loop 72 is nearer to a lock condition when the false lock signal is no longer asserted.

Figure 7:
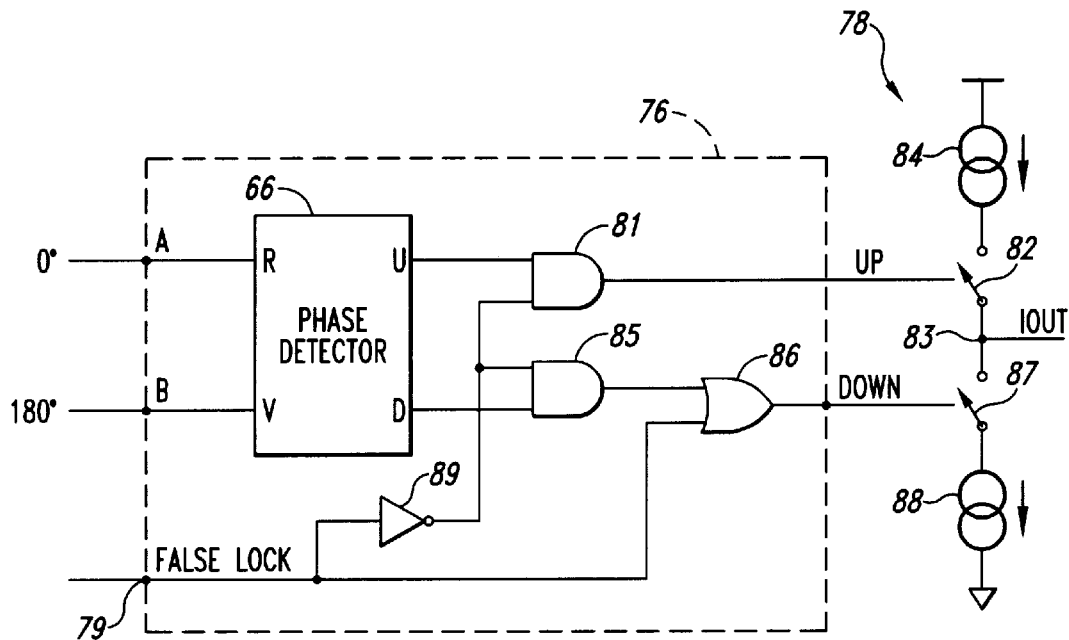
FIG. 7 is a more detailed view of the phase detector and the charge pump of FIG. 6.

FIG. 7 illustrates the use of the output signal of the flip-flop to ultimately control the charge pump 78. In FIG. 7, under normal operation conditions, a phase detector component 66 produces a signal at either the up terminal or the down terminal. The signal available at the up terminal propagates through an AND gate 81 to operate a switch 82 which connects an output terminal 83 to a constant current source 84 of current I. The down signal propagates through an AND gate 85 and an OR gate 86 to operate a switch 87 which connects the output terminal 83 to a constant current sink 88 of the same current I. During normal operation, the false lock signal is low. AND gates 81 and 85 are enabled by virtue of the inverter 89, thereby allowing the up and down signals to propagate therethrough. However, upon assertion of the false lock signal, the inverter 89 causes the signal input to the AND gates 81 and 85 to be low thereby preventing the up and down signals from propagating therethrough. The false lock signal also propagates through the OR gate 86 to operate the switch 87. In that manner, the false lock signal can override the normal up/down signals produced by the phase detector component 66 to connect the output terminal 83 to the constant current sink 88.

Figure 8:
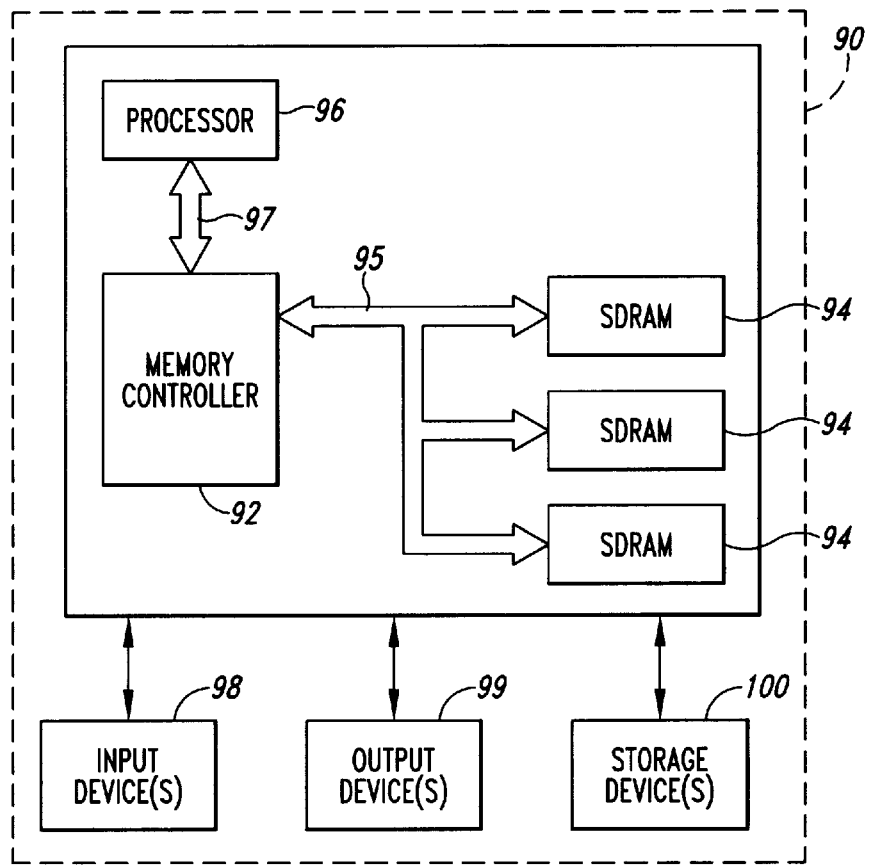
FIG. 8 illustrates a block diagram of a system in which the invention shown in FIG. 3 may be used.

FIG. 8 is a block diagram of a computer system 90. The computer system 90 utilizes a memory controller 92 in communication with memory devices which may be SDRAMs 94 through a bus 95. The memory controller 92 is also in communication with a processor 96 through a bus 97. The processor 96 can perform a plurality of functions based on information and data stored in the SDRAMs 94. One or more input devices 98, such as a keypad or a mouse, are connected to the processor 96 to allow an operator to manually input data, instructions, etc. One or more output devices 99 are provided to display or otherwise output data generated by the processor 96. Examples of output devices include printers and video display units. One or more data storage devices 100 may be coupled to the processor 96 to store data on, or retrieve information from, external storage media. Examples of storage devices 100 and storage media include drives that accept hard and floppy disks, tape cassettes, and CD read only memories.

The present invention is also directed to a method of determining false lock of a locked loop which produces a plurality of output signals in response to a clock signal. The method is comprised of the steps of determining if a predetermined phase relationship exists between first and second signals produced by the locked loop. An output signal is produced which is indicative of that determination.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A method of generating an internal clock signal, comprising:

adjusting the phase of the internal clock signal relative to the phase of a reference clock signal, the phase of the internal clock signal being adjusted as a function of the phase relationship between the internal clock signal and the reference clock signal in an attempt to maintain a predetermined phase relationship between the internal clock signal and the reference clock signal;

detecting a predetermined condition of the phase of the internal clock signal relative to the phase of the reference clock signal; and altering the phase of the internal clock signal in a single direction responsive to detecting the predetermined condition until the predetermined phase relationship between the internal clock signal and the reference clock signal is achieved.

2. The method of claim 1 wherein the act of adjusting the phase of the internal clock signal comprises adjusting the phase of the internal clock signal relative to the reference clock signal using a locked loop.

3. The method of claim 2 wherein the locked loop comprises a delay-locked loop.

4. The method of claim 2 wherein the act of detecting a predetermined condition of the phase of the internal clock signal relative to the phase of the reference clock signal comprises detecting a false lock condition of the locked loop using the reference clock signal and at least one clock signal generated by the locked loop.

5. The method of claim 4 wherein the act of detecting a false lock condition of the locked loop using the reference clock signal and the clock signal generated by the locked loop comprises detecting a false lock condition of the locked loop using a signal generated by the locked loop having a phase relative to the phase of the reference clock signal of approximately 90 degrees.

6. The method of claim 4 wherein the act of detecting a false lock condition of the locked loop using the reference clock signal and the clock signal generated by the locked loop comprises examining the logic level of one of either the clock signal generated by the locked loop or the reference clock signal at a transition of the other of either the clock signal generated by the locked loop or the reference clock signal.

7. A method of generating an internal clock signal, comprising:

delaying a reference clock signal to obtain first and second delayed clock signals having phases that are different from each other and from the phase of the reference clock signal, one of the delayed clock signals being used as the internal clock signal;

detecting a phase relationship between the reference clock signal and the first delayed clock signal;

adjusting the magnitude of the delay of the reference clock signal as a function of the phase relationship between the reference clock signal and the first delayed clock signal;

determining a phase relationship between the first and second delayed clock signals;

in response to detecting a predetermined condition of the phase relationship between the first and second delayed clock signals, adjusting the magnitude of the delay of the reference clock signal in a predetermined manner.

8. The method of claim 7 wherein the act of delaying the reference clock signal to obtain first and second delayed clock signals comprises applying the reference clock signal to a delay line.

9. The method of claim 7 wherein the act of detecting a phase relationship between the first and second delayed clock signals comprises determining the logic level of one of the first and second delayed clock signals during a transition of the other of the first and second delayed clock signals.

10. The method of claimed 7 wherein the act of adjusting the magnitude of the delay of the reference clock signal in a predetermined manner comprises adjusting the magnitude of the delay of the reference clock signal until a predetermined phase relationship between the reference clock signal and the first delayed clock signal is achieved.

11. In a memory device receiving a digital signal applied to the memory device along with an external clock signal, a method of capturing the digital signal in the memory device, comprising:

delaying the external clock signal to obtain first and second delayed clock signals having phases that are different from each other and from the phase of the external clock signal;

detecting a phase relationship between the external clock signal and the first delayed clock signal;

adjusting the magnitude of the delay of the external clock signal as a function of the phase relationship between the external clock signal and the first delayed clock signal;

determining a phase relationship between the first and second delayed clock signals;

in response to detecting a predetermined condition of the phase relationship between the first and second delayed clock signals, adjusting the magnitude of the delay of the external clock signal in a predetermined manner; and capturing the digital signal responsive to a transition of one of the first and second delayed clock signals.

12. The method of claim 11 wherein the act of delaying the external clock signal to obtain first and second delayed clock signals comprises applying the external clock signal to a delay line.

13. The method of claim 11 wherein the act of detecting a phase relationship between the first and second delayed clock signals comprises determining the logic level of one of the first and second delayed clock signals during a transition of the other of the first and second delayed clock signals.

14. The method of claim 11 wherein the act of adjusting the magnitude of the delay of the external clock signal in a predetermined manner comprises adjusting the magnitude of the delay of the external clock signal until a predetermined phase relationship between the external clock signal and the first delayed clock signal is achieved.

* * * * *

UNITED STATES PATENT AND TRADEMARK OFFICE
CERTIFICATE OF CORRECTION

PATENT NO. : 6,119,242  
DATED : September 12, 2000  
INVENTOR(S) : Ronnie M. Harrison Page 1 of 1

It is certified that error appears in the above-identified patent and that said Letters Patent is hereby corrected as shown below:

<u>Title page,</u>
OTHER PUBLICATIONS (Novof),
Line 2, "Loop with 15 to 249 MHz" should read -- Loop with 15 to 240 MHz --

<u>Column 8,</u>
Line 14, "claimed 7" should read -- claim 7 --

Signed and Sealed this

Eighteenth Day of December, 2001

*Attest:*

JAMES E. ROGAN
*Attesting Officer*     *Director of the United States Patent and Trademark Office*